United States Patent [19]

Bechtel et al.

[11] Patent Number: 5,182,632
[45] Date of Patent: Jan. 26, 1993

[54] HIGH DENSITY MULTICHIP PACKAGE WITH INTERCONNECT STRUCTURE AND HEATSINK

[75] Inventors: Richard L. Bechtel, Sunnyvale; Mammen Thomas, San Jose; James W. Hively, Sunnyvale, all of Calif.

[73] Assignee: Tactical Fabs, Inc., San Jose, Calif.

[21] Appl. No.: 804,614

[22] Filed: Dec. 2, 1991

Related U.S. Application Data

[63] Continuation of Ser. No. 440,545, Nov. 22, 1989, abandoned.

[51] Int. Cl.[5] .......................................... H01L 23/34
[52] U.S. Cl. ................................... 257/713; 257/724
[58] Field of Search .................. 357/81, 75, 74, 68; 361/386

[56] References Cited

U.S. PATENT DOCUMENTS

| | | | |
|---|---|---|---|
| 4,544,989 | 10/1985 | Nakabu et al. | 357/81 |
| 4,677,526 | 6/1987 | Muehling | 357/81 |
| 4,731,699 | 3/1988 | Nitta et al. | 357/81 |
| 4,742,024 | 5/1988 | Sugimoto et al. | 357/81 |
| 4,744,007 | 5/1988 | Watari et al. | 357/81 |
| 4,751,482 | 6/1988 | Fukuta et al. | 357/74 |
| 4,823,234 | 4/1989 | Konishi et al. | 357/81 |
| 4,835,598 | 5/1989 | Higuchi et al. | 357/81 |
| 4,860,165 | 8/1989 | Cassinelli | 357/81 |
| 4,873,615 | 10/1989 | Grabbe | 357/81 |
| 4,939,570 | 7/1990 | Bickford et al. | 357/81 |

OTHER PUBLICATIONS

A. C. Adams et al., "Advanced Packaging for VLSI-Based Systems", Suss Report, Nov. 1987, pp. 2-3.
Bill Blood and Allison Casey, "Evaluating MCM Packaging Technology", ASIC Technology and News, Aug. 1991, vol. 3, No. 4, p. 22.
R. E. Thun et al., "Section B-17: Printed and Molded Circuits; Integrated Microcircuits", Insulation/Circuits—Directory/Encyclopedia Issue, Jun./Jul. 1971, pp. 217-231.

Primary Examiner—Rolf Hille
Assistant Examiner—S. V. Clark
Attorney, Agent, or Firm—Skjerven, Morrill, MacPherson, Franklin & Friel

[57] ABSTRACT

A package for multiple semiconductor integrated circuit chips uses an interconnect structure manufactured by semiconductor processing techniques to provide dense interconnections between chips and to input/output terminals. Chips are thermally connected to a Kovar or molybdenum heatsink. The interconnect structure is constructed by fabricating multiple layers of interconnect metallization on an optically flat glass (or other dielectric) surface patterned into lines and separated by smoothed glass dielectric. The metallization lines are interconnected by vias and lead to pads which are connected to chip pads and to exterior pins or wiring. An interconnect frame allows access to the chips and the interconnect structure to effect wire bonding of the chips to the metallization and provide sealable cavities for the chips. Elastomeric connectors extend through and are aligned by the frame to connect pads on the interconnect structure top to traces on a mother board to which the package is mounted. Chip bonding plates allow chips to be removed from the package and replaced when found defective.

51 Claims, 13 Drawing Sheets

HIGH DENSITY MULTICHIP PACKAGE WITH INTERCONNECT STRUCTURE AND HEATSINK

This application is a continuation of application Ser. No. 07/440,545, filed Nov. 22, 1989, now abandoned.

BACKGROUND OF THE INVENTION

1. Field of the Invention

This invention relates to an integrated circuit chip package and interconnection assembly. More particularly it relates to a multichip package which provides for exceptionally high density electrical interconnection between multiple chips in one package.

2. Material Art

In a system of integrated circuits, there are two primary factors that influence the speed by which the integrated circuits of the system are able to receive, process and transmit electrical signals. These factors are: (1) how cool the circuits can be maintained and (2) how fast electrical signals can be transferred between components or elements of the circuits. Heat slows the operational capability of IC chips. Low temperature is difficult to achieve with conventional IC chip packaging because the package itself prohibits direct contact of a cooling medium to the IC chip for heat removal. Speed of electrical signal transfer relates to length of the electrical signal paths, and has been limited by the inability to provide interconnect densities on a conventional printed circuit board that rival those achievable on the integrated circuit chips themselves. Typical interconnect metallization line widths on IC chips have dimensions less than 10 microns whereas line widths on high performance printed circuit boards are more on the order of 125 microns. Thus, even though IC chips continue to increase in density, conventional packaging at the chip and system level has not followed this density increase because of such fundamental limitations as minimum line width on printed circuit boards.

In response to this need for higher density interconnection between chips, the development of improved packaging concepts is of major importance. One fairly early concept is seen in Doelp, U.S. Pat. No. 3,374,537 where, as shown in FIG. 1, thin film petal-type interconnections 6 and 14 are provided on a transparent glass substrate 4. Interconnect 14 connects between chips 10 and interconnect 6 and provides input and output connections from chips 10 to external leads of the package.

Jarvela, U.S. Pat. No. 4,000,509 discloses a high density multichip package. As shown in FIGS. 2A and 2B, Jarvela provides a wafer carrier assembly 12 attached to a heat sink 16. The wafer carrier assembly generally consists of a circular silicon wafer 21 having signal and power distribution circuit networks formed thereon. Wafer 21 is attached to a molybdenum stiffener for mechanical strength, which is connected through thermal grease 20 to heat sink 16. The thermal grease improves thermal conductivity between the heat generating chips 23 and the outside of the package. A plurality of chips 23 are mounted on the wafer and electrically connected to the circuit networks on the wafer 21. However, the glass or other electrically insulating material of wafer 21 also provides undesired thermal insulation between chips 23 and the heat sink 16.

SUMMARY OF THE INVENTION

According to the present invention, a multichip package and interconnect assembly is provided which is manufacturable using current technology, and allows extremely short dense interconnection between chips as well as good heat conduction from the chips to the package exterior. This invention offers the ability to integrate within the package thin film passive components such as resistors and capacitors not included in the integrated circuit chips. Manufacture is cost effective, and the manufactured product is reworkable and repairable. A package according to the present invention can be replaced easily in the field, has a low profile, and provides a sealed environment for multiple chips. The preferred embodiment has closely matched thermal properties and may either be air or liquid cooled. If liquid cooled, the package requires fewer coolant connections than individual packages would require. The overall footprint area of a nine chip package version of this invention occupies only about 1/6 of the area occupied by nine prior art pin grid array packages which are soldered onto a conventional printed circuit board upon which the interconnect wiring from chip to chip is accomplished. Moreover, worse case transit time of signals between chips is typically about 1/5 that of using individual packages. A major factor in this capability for high density and performance is the ability to achieve metallization interconnect densities comparable to those achievable on semiconductor integrated circuit chips themselves. This increased interconnect density is achievable because these interconnections are constructed on optically-flat glass or similar substrates, or on flat metal substrates that have been coated with a suitable dielectric material such as an oxide which is planarized to a near-optically-flat surface. These interconnect structures can then be processed using semiconductor design rules.

FIRST EMBODIMENT

A multichip package embodiment providing all the advantages recited above uses a base for attaching integrated circuit chips which serves as both a heatsink and a wall of the package. For a package which will house silicon integrated circuit chips, the base is preferably of Kovar or molybdenum, both of which have thermal expansion coefficients close to silicon. Several integrated circuit chips are adhered to the inner surface of this base. A multilayer interconnect structure is also attached to this inner surface. The interconnect structure has apertures which correspond to the locations of the chips on the base. The interconnect structure is positioned on the base such that the apertures surround the chips for which they are intended. This interconnect structure includes pads physically located in positions sequenced to match bonding pads of the chips and includes lines which interconnect these pads in a desired manner. Connection from the chip pads to the interconnect substrate pads is accomplished by wire bonds or tape automated bonding (typically fine copper leads bonded onto a Kapton film). To facilitate rework, redundant electrically common bonding sites may be provided in close proximity on each pad of the interconnect structure, such that if damage to one bonding site occurs when a bond is removed, a fresh electrically common bonding site is available. Also to facilitate rework, the chip may be mounted to a chip bond plate as will be discussed later.

The multilayer interconnect structure is formed on a flat plate, preferably optically flat, typically glass or silicon. Thin film metallization is deposited onto this plate, preferably by vacuum deposition, and delineated into circuitry by photolithography and microetching techniques common to the semiconductor manufacturing industry. A dielectric such as silicon dioxide, silicon nitride, spin-on-glass, or an organic compound such as polyimide is deposited over the surface, and small holes or vias are photolithographically defined and chemically etched into this dielectric. Subsequent layers of conductive interconnect and dielectric are formed to generate an appropriate interconnect structure for interconnecting the particular chips in the desired way, the vias in the insulation layers providing contact between one conductive layer and the next. Resistors can be formed in this interconnect structure by using nichrome, polycrystalline silicon, or other suitable resistive material as one of the conductive layers. Depending upon the patterning, a resistive layer (for example nichrome) need not be separated from a conductive layer (for example aluminum) by dielectric. Capacitors can be formed by properly patterning adjacent metal layers which are separated from each other by thin dielectric.

SECOND EMBODIMENT

Another version of the multichip package uses a molybdenum heat sink on which is formed an insulation layer such as CVD oxide, nitride, polyimide, or spin-on-glass having a planar surface as a base for unitary construction of the interconnect substrate. Alternating layers of metal and dielectric, interconnected by vias, as described in connection with the first embodiment, are formed to create the interconnect structure, including apertures for integrated circuit chips, and if desired, including resistors and capacitors. Integrated circuit chips are connected to the interconnect structure as in the first embodiment.

THIRD EMBODIMENT

A third version of the multichip package attaches the interconnect structure to a surface other than the heat sink, preferably a back plate which will fit opposite the heat sink such that if the heat sink forms the ceiling of the package and the integrated circuit chips are attached to the ceiling, the interconnect structure is attached to the back plate which is the floor. In this embodiment wiring extends from bonding pads on the interconnect structure located on the floor up to bonding pads on the chips attached to the ceiling of the package.

In this embodiment, wiring is provided by tape automated bonding structures. Manufacture of the package according to this embodiment preferably involves forming the interconnect structure, shaping tape automated bonding (TAB) structures to be non-planar, attaching the outer leads of the TAB structures to the interconnect structure, such that locations where the integrated circuit chips will be placed are elevated above the interconnect structure, then attaching the chips to this elevated region. The chips are then thermally attached to the heat sink at the ceiling using thermal grease.

This embodiment is preferred for providing easy interconnection from the interconnect structure directly through the floor to an adjacent mother board, for locating the heat generating integrated circuit chips away from this mother board, and for providing a heatsink/chip combination in which chips can be conveniently replaced when defective.

FOURTH EMBODIMENT

A fourth embodiment provides an interconnect structure as discussed above and integrated circuit chips placed on the surface of the interconnect structure and attached to the interconnect structure by flip-chip solder bump bonding (placing bumps of solder onto contact pads on either or both of the chips and the interconnect substrate, then positioning points to be joined against each other while heating). In this embodiment, the chips are preferably thermally attached to a heatsink by thermal grease.

MULTIPLE INTERCONNECT STRUCTURES FROM SINGLE WAFER

The initial form of the heatsink can be that of a wafer which can be processed on semiconductor processing equipment. Several packages can be formed on one wafer and sawn or otherwise cut into individual heatsink/interconnect structures for receiving integrated circuit chips.

CHIP BOND PLATE

A further refinement applicable to the first two above multi-chip package embodiments, and a feature that provides rework capability to remove defective chips for replacement without damaging the chip bond sites of the interconnect structure, involves implementing a special chip bond plate. This plate is typically made of thin molybdenum, on the order of 10 to 15 mils thick, and is slightly larger in area than the chip that is to be bonded to the interconnect structure. The chip is attached, typically with epoxy, to the chip bond plate, which is then reflow soldered to the heatsink using a solder of lower melting temperature than the temperature required during and after bonding the chip to the plate, in order to prevent outgassing of the cured epoxy and further stressing of the chip and chip bond. If necessary to remove the chip for replacement, the solder can be locally melted by application of heated nitrogen or other means. This chip bond plate is not essential to allow replacement of the chip if the chip is of a type compatible with a solder such as a gold-tin or gold-silicon eutectic, in which case the chip can be soldered directly to the heatsink.

Solder, unlike epoxy, does not leave behind difficult to remove solids such that a subsequent rebond cannot be cleanly achieved. With solder, reheating produces a molten material that can be cleanly removed by suction techniques leaving a fresh, clean surface for rebond. Rebond of a replacement chip can be accomplished again by reflow.

REDUNDANT BONDING SITES ON INTERCONNECT BOND PADS

A still further refinement applicable to any of the above multichip packages, and a feature that provides rework capability to remove defective chips for replacement, involves the incorporation of redundant wire or TAB bonding sites in pairs (or higher multiplicity) on the pads which are part of the interconnect structure. Such redundant interconnect structure bonding sites, which are in close proximity and electrically common, provide the ability to have a fresh bonding site available in the event that one site is damaged beyond use during the removal of a defective chip and its wire or TAB bonds. The high wiring density of the present invention leaves room within a specified space in the interconnect structure for redundant bonding sites.

After the integrated circuit chips and interconnect structure have been electrically joined, for example by wire bonding, the package is completed such that the chips and interconnect structure are sealed within the package. Leads for connecting to outside structures extend from the exterior of the package. The single package contains a plurality of chips, an extensive number of interconnects between the chips inside the package, and some inter connection to leads extending from the exterior of the package. Flat glass (preferably optically flat), or similar material (for the first embodiment) or a heat sink coated with a planarized dielectric (for the second embodiment) is used as the interconnect substrate, and metallization for interconnection is formed using semiconductor manufacturing techniques. Therefore, a very high density of interconnect metallization can be formed between chips within the package, and the interconnect lines can have shorter length and much smaller capacitance than the interconnect lines on a printed circuit board which connects conventionally packaged chips. Line width in the interconnect structure can be less than 10 microns, as compared to typically 125 microns for conventional packaging and printed circuit board technology.

DETAILED DESCRIPTION

Figure 3A:
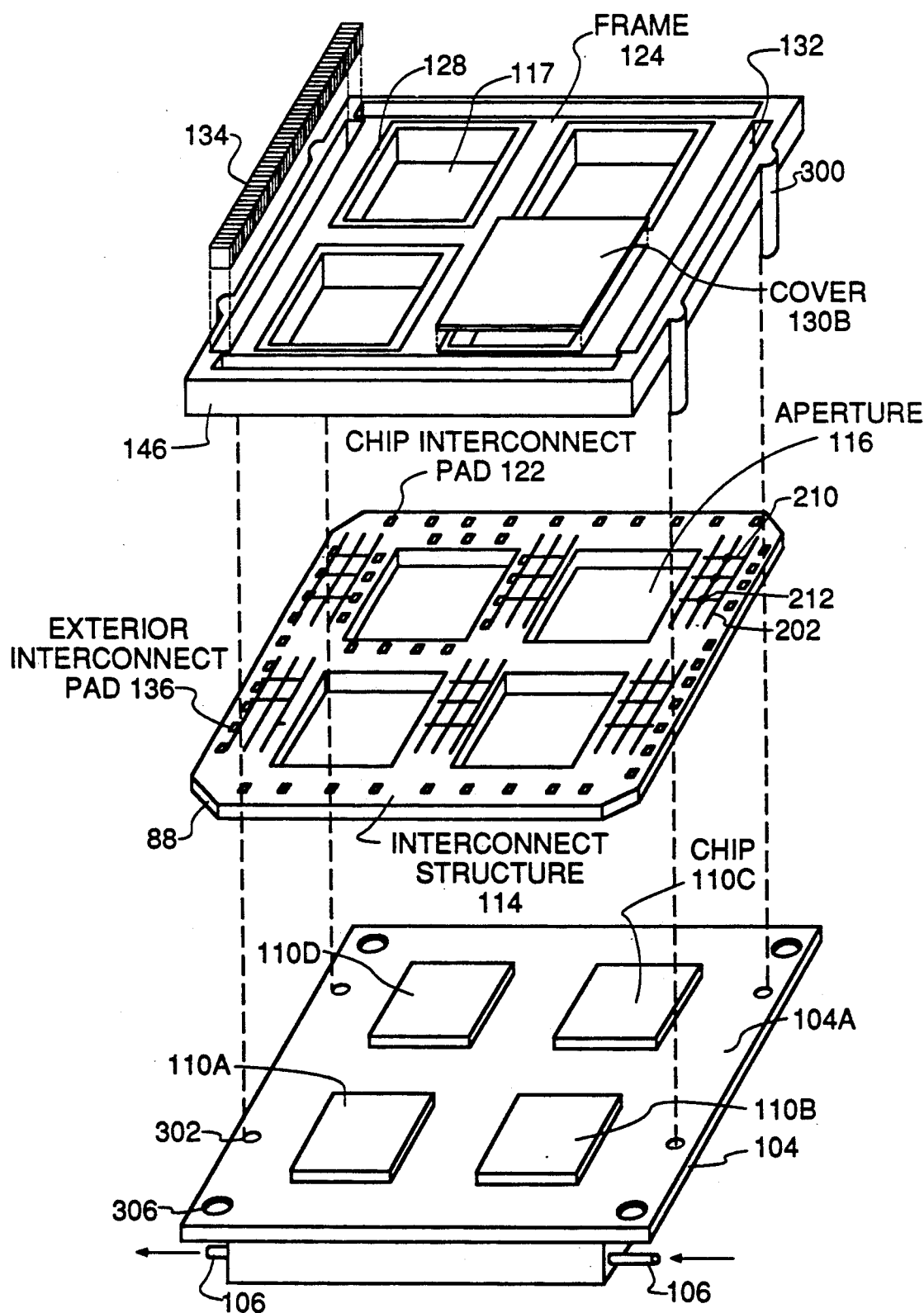
FIG. 3A is an exploded perspective view of a package of the present invention showing a heatsink on which a plurality of integrated circuit chips are located, an interconnect structure for placing on the heatsink, and a cover having openings for attaching the integrated circuit chips to the interconnect structure.
Figure 3B:
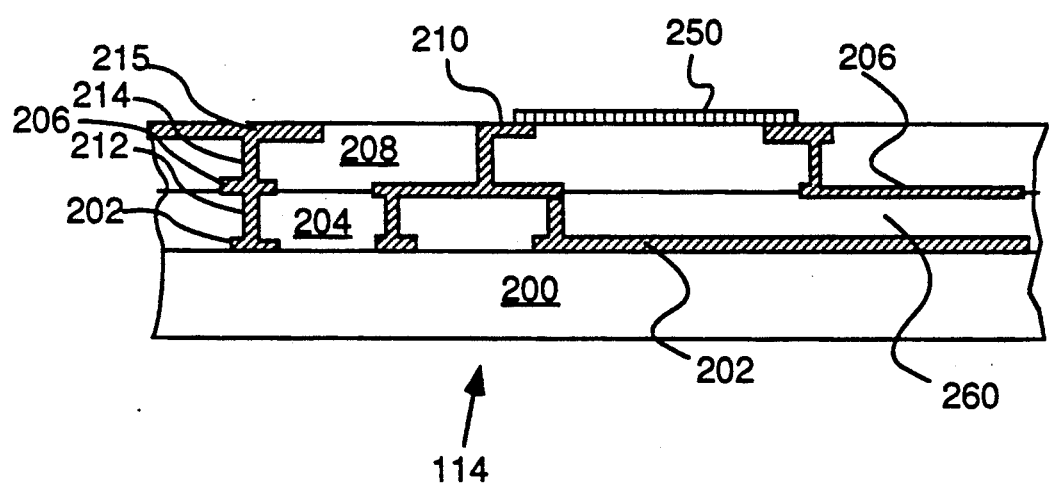
FIG. 3B is a cross-sectional view of a portion of an interconnect structure such as shown in FIG. 3A.
Figure 3C:
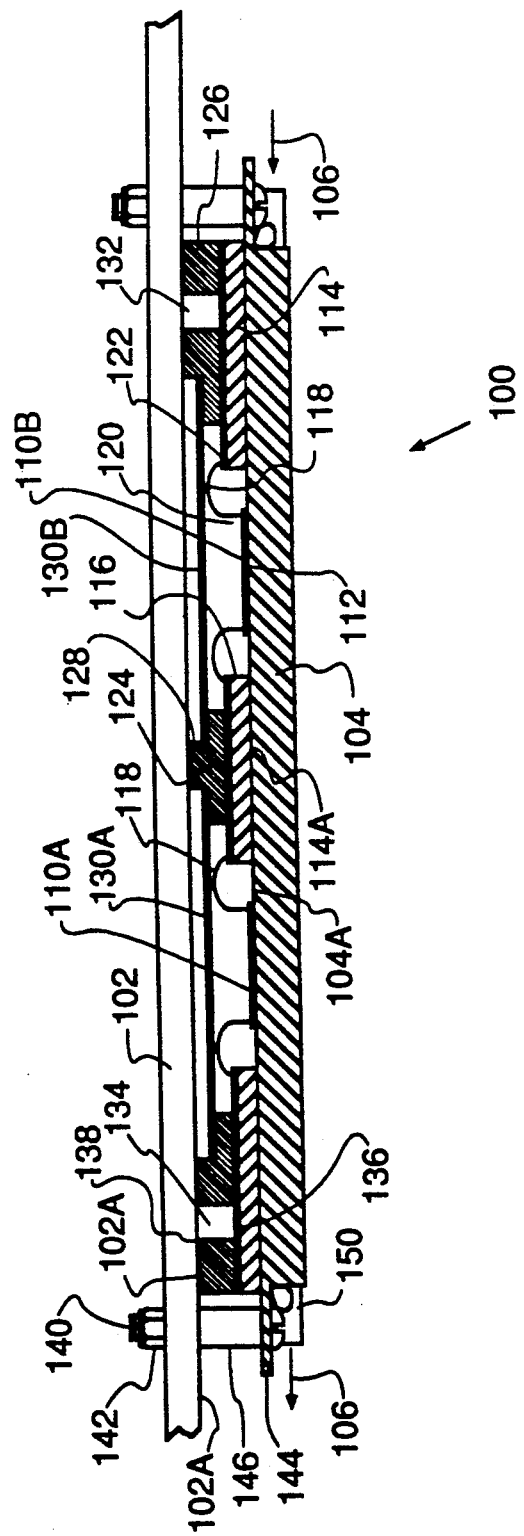
FIG. 3C is a cross-sectional side view of an assembled package such as shown in exploded view in FIG. 3A.

FIGS. 3A-3C illustrate a first embodiment of the present invention. As shown in FIGS. 3A and 3C, heatsink 104 includes means for cooling which in this case is a means for circulating a fluid through pipe 106. Attached to the upper surface 104A of heatsink 104 are a plurality, in this case four, of integrated circuit chips 110A, 110B, 110C, and 110D. Interconnect structure 114 fits onto heatsink 104 such that apertures 116 surround each of the integrated circuit chips 110A through 110D. Various levels of dielectric-encapsulated metallization 202, 210 are seen on the interconnect structure 114 with vias 212 extending to or between those levels. Electrical contacts 136 are provided at the periphery of the upper level of metallization 210. When assembled, interconnect structure 114 is separated in space from each of integrated circuit chips 110A through 110D but interconnected electrically through wiring means 118 (see FIG. 3C). Integrated circuit chips 110A, 110B, 110C, 110D, (see also FIG. 3A), are bonded in spaced positions, by suitable heat conductive adhesive means 112 (see FIG. 3C) such as silver filled epoxy or solder, to the inwardly-facing surface 104A of heatsink 104. Thus each chip 110A, 110B, etc. sits in an aperture 116 in interconnect structure 114. A frame 124, preferably plastic or ceramic, covers interconnect structure 114 and chips 110A through 110D, forming in combination with heatsink 104 a sealed package which protects the chips and the interconnect structure. Frame 124 can be bonded to or mechanically attached to the interconnect structure 114 and has apertures or chip wells 128 which are aligned with interconnect structure apertures 116 and which allow access for wire bonding or repair. Rectangular elongated slots 132 are provided near each edge of the frame 124 extending essentially the length of the corresponding edge of underlying interconnect structure 114. A depending peripheral rim 126 of frame 124 surrounds the periphery of the interconnect structure 114 when the parts are assembled. Chip lids such as 130B of plastic or ceramic are bonded to frame 124 by thermal fusion (plastic-to-plastic), epoxy, or solder (metal plated ceramic lid to metal plated ceramic frame) to cover the chip wells or apertures 128 after wire bonding of the connect pads 120 on each of the chips and connect pads 122 on the interconnect structure.

Elastomeric conducting strips 134 such as Tecknit Zebra Series 7000/8000 (more clearly shown in FIG. 3A) are positioned in slots 132 and when assembled and compressed on the mother board 102 (FIG. 1) electrically connect contact pads or traces 138 on the mother board to the contact pads 136 on the periphery of the interconnect structure.

As shown in FIG. 3A, anchoring/alignment pins 300 extend from the frame 124 and upon assembly pass through pin apertures 302 into the heatsink, after which the pins are secured. If the pins are plastic the pins may be secured by melting the protruding end of each pin into a ball 150, which prevents retraction of the pin.

Alternatively, if the pin is threaded metal (i.e., a bolt, not shown) a nut may be used to retain the pin. The end result is positive alignment and firm retention of the frame to the heatsink enclosing the interconnect structure and chips. Mounting apertures 306 are provided at each corner of the heatsink 104 for mounting bolts 140 (see FIG. 3C). The glass interconnect structure 114 may be mitered at each corner 88 to provide access for the package mounting bolts 140 to the mating holes 306 in the heatsink 104.

Shown in FIG. 3C are interchip interconnects 118 and package-to-mother board interconnect assemblies 134. The package is shown as mounted on a printed circuit mother board 102. The package 100 is constructed by first providing metal heatsink 104, preferably of rectangular or square plan configuration. Heatsink 104 in a preferred embodiment is Kovar or molybdenum metal. As is known in the art, coolant passages 106 can be provided within the heatsink 104 through which a fluid coolant such as water, air or Freon may be circulated for cooling, or the heatsink can be provided with fins for air cooling. Arrows illustrate the inflow and outflow of the coolant along passages 106. An optically flat glass or quartz substrate 200 (see FIG. 3B) is used for forming interconnect structure 114 (made of a low thermal expansion glass so as to thermally match the silicon chips). Onto this optically flat glass substrate 200 are applied patterned interconnect lines 202, 206, 215 interlaced with electrical insulation material 204, 208 to form multilayer structure 114 including a plurality of interconnect lines, each line extending from a pad 122 (see FIG. 3A perspective view), to which a chip will be connected, to another pad 122, to which a chip will be connected, or to a pad 136, which will be connected to the exterior of the package. The layers of interconnect structure 114 are shown in more detail in FIG. 3B, and are discussed below. Interconnect structure 114 is preferably epoxy or solder bonded to the heatsink surface 104A with the apertures 116 in interconnect structure 114 peripherally surrounding the chips 110A, 110B, etc. For solder bonding to heatsink 104, the back side 114a of the interconnect structure 114 can be coated with a suitable solderable metal such as nickel. Wire bonds 118 (see FIG. 3C, also FIG. 4A) or tape automated bonding (TAB) electrical connections 222 (see FIG. 4B) are made between chip connect pads 120 on the periphery of chips 110A, 110B, 110C, and 110D to pads 122 on interconnect structure 114 to electrically connect the chips. FIGS. 4D and 4E show in plan view typical TAB structures to the center of which an integrated circuit chip can be bonded. As shown in FIG. 4D, line end 7 is available for bonding to a corresponding pad in a chip and line end 8 is available for bonding to a pad in the interconnect structure. FIG. 4E shows another TAB structure for a chip having fewer bonding pads. After the TAB structure of FIGS. 4D and 4E are bonded to the interconnect structure, the exterior metal comprising portions 9, 10 and 11 of FIG. 4D and portions outside the dotted line 12 of FIG. 4E are removed, thus electrically separating the plurality of leads. Following the wire or TAB bonding, an insulating frame 124 typically of ceramic or plastic insulating material is mounted over interconnect structure 114 and the chips 110A–110D, and attached to heatsink 104. In the case of wire bonding, the frame 124 preferably includes apertures 117 having dimensions greater than apertures 116 to provide clearance for, and access to, wire bonds 118. Chip lids such as 130B (see FIG. 3A) fit into mating recessed areas 128 and close each of the apertures 117, shielding the chips 110A–110D located beneath. Chip lids such as 130B may be pressed, epoxied, thermally fused or soldered in place depending on the material used and the level of chip protection desired.

Peripheral slots 132 are provided along each peripheral edge of frame 124, and elastomeric connector strips 134 are positioned in the slots to connect contact pads 136 on the glass interconnect structure to contact pads 138 on mother board 102 (see FIG. 3C) when the package 100 is mounted thereon. Package 100 is mounted to the mother board 102 by compression screws 140 and nuts 142 extending through mother board 102 and an outer flange portion 144 of heatsink 104. Compression-limiting spacers 146 extend between inner surface 102A of mother board 102 and inner surface 104A of the heatsink 104. The resultant clamping action mounts package 100 to board 102 and ensures electrical contact between contacts 136 on interconnect structure 114 and contacts 138 on mother board 102 through connection strip 134. The resultant structure 100, when mounted, provides a rigid and sealed assembly.

INTERCONNECT STRUCTURE

The high density and short (hence, high speed) interconnects of the present invention are provided by the construction of the interconnect structure 114. A preferred form of interconnect structure 114 is seen in FIG. 3B where a typical borosilicate or quartz flat glass plate 200 is provided as a substrate of the interconnect structure. The glass plate 200 has a smooth top surface comparable in flatness to a semiconductor wafer, and thus can be processed with equivalent tolerances. A first layer 202 of thin film metallization, typically of aluminum and typically 1 micron in thickness, is deposited and delineated using known photolithographic and microetching techniques to form metallization interconnect lines having widths as narrow as 10 microns or less on the top surface of glass plate 200. A first dielectric layer 204, preferably of spin-on-glass such as Allied Signal Technologies Accuglass X-11 for planarization, or of silicon dioxide or the like, typically deposited by known chemical vapor deposition techniques, is formed over the first metallization layer 202. The dielectric layer 204 can be further planarized, if necessary, by well known mechanical or chemical means, to provide a near-planar top surface, and a second metallization pattern 206 deposited and patterned. An additional layer 208 of smoothed dielectric and an additional layer 210 of metallization may be formed thereover resulting in a dense mass of spaced interconnects (traces) and also providing input/output pads for lines to and from the chips. Before forming subsequent metallization layers, vias 212, 214 etc. (i.e., holes) are etched in the various dielectric layers 204, 208 (respectively) to afford desired connections to and between various levels of metallization in the interconnect structure, as known in the art. Thin film resistors such as resistor 250, typically of nichrome, can be integrated into the structure, as well as capacitors such as capacitor 260. Additional layers of metallization and dielectric can be added as desired. Multiple interconnect structures 114 can be fabricated using a large master glass plate which is cut apart to form individual interconnect structures. For example, four 10 cm × 10 cm square interconnect structures can be fabricated on one 20 cm × 20 cm square glass plate.

Inherent also in the process is the ability to custom tailor the characteristic impedance of the interconnect structure in accordance with established formulas by any combination of the following: selecting specific thicknesses of the dielectric material(s) 104 and 208, and selecting dielectric material(s) having a differing dielectric constant for use in dielectrics 204 and 208, selecting specific thicknesses of lines 202, 206 and 215 and selecting lateral line-to-line spacing between adjacent lines in a single layer such as 202, 206 or 215. This is true in the case of all the embodiments of this invention.

CHIP BONDING PLATE

Figure 4A:
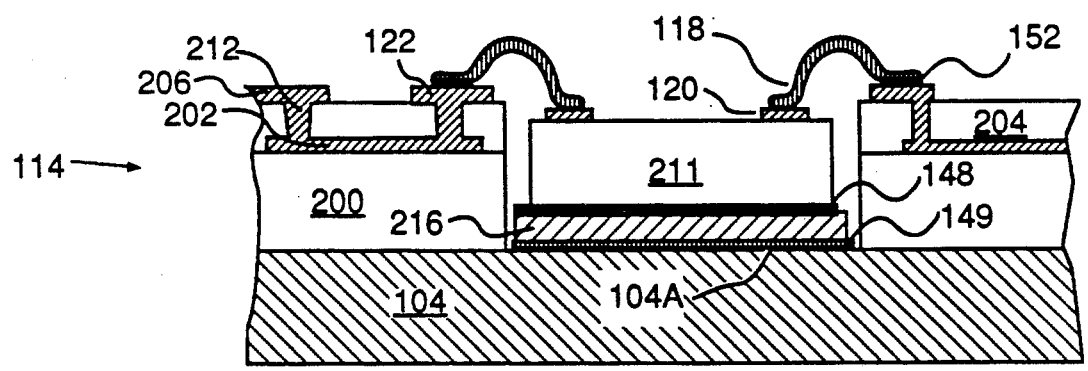
FIGS. 4A, 4B, and 4C are cross-sectional side views of an interconnect structure and an integrated circuit chip connected by wire bonds, TAB bonds and solder bumps respectively.

FIG. 4A illustrates a schematic partial cross-section of interconnect structure 114 for the first embodiment, in which interconnect structure 114 is mounted on heatsink 104. FIG. 4A depicts the attachment of a chip 211 in thermal contact with heatsink 104 for optimum thermal efficiency in cooling of chip 211. Electrical connection of pads 120 of the chip to pads 122 of the interconnect metallization is depicted here and in FIG. 3C using wire bonds 118.

Introduced in the embodiment of FIG. 4A is a chip bonding plate 216 which can be used with all package embodiments described herein to facilitate rework. The chip bonding plate 216 is typically of larger dimensions than the chip 211, to facilitate handling, and is of a material, such as molybdenum or Kovar in the case of a silicon chip, that has a close match of thermal expansion coefficient to the chip. Chip bonding plate 216 is typically 10 to 15 mils in thickness. The attachment of chip 211 to plate 216 is accomplished by using epoxy, gold eutectic bonding, or a high temperature solder 148. In the embodiment of FIG. 4A, the chip bonding plate 216 is then attached to the surface 104A of the heat sink 104 in a position which may be surrounded by or adjacent to the interconnect structure 114.

Attachment of bonded chip bond plate 216 to heatsink 104 is accomplished using a solder 149 having a melting temperature lower than the temperature used for attaching the chip to the plate. Likewise, attachment of TABs 222 (FIG. 4B) to interconnect lines 122 is by thermocompression bonding or by solder 152 having a melting temperature less than the temperature used for attaching chip 211 to plate 216. Such attachment is reworkable (i.e.; a defective chip can be removed) by selectively melting the low temperature solder 149 and 152, by localized direction of a heated inert gas such as nitrogen, to remove plate 216 of a defective chip without damaging the interconnect structure or heatsink. The location where the defective chip was removed is then cleanable and restorable by removing any residual solder remaining on surface 104A through conventional means, for example a suction device; whereas, if the chip was directly bonded to the heatsink using epoxy without the use of a chip bond plate said epoxy would have a tendency to leave behind difficult-to-remove solids that could greatly hamper rebond. The final step in replacement of a defective chip is accomplished by reflow soldering a new chip.

CHIP BONDING PLATE OPTIONAL

Figure 4B:
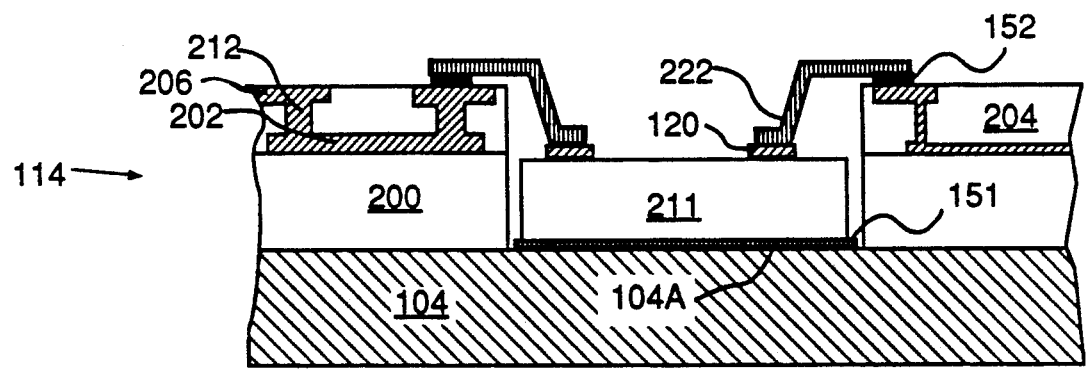

In the embodiment of FIG. 4B the chip is attached directly to heatsink 104 using a solder compatible with the chip.

FIG. 4B follows the same description as FIG. 4A with two exceptions. The electrical connection from chip pads 120 to interconnect metallization pads 122 is depicted using TABs 222. No chip bonding plate is provided, chip 211 being attached directly to heatsink 104. If the chip is a type which can tolerate application of solder directly to its back surface (for example a bipolar circuit chip with a silicon substrate which can accept a gold-tin-silicon eutectic solder), the chip 211 may be soldered by solder 151 directly to heatsink 104 and still be removable.

Figure 4C:
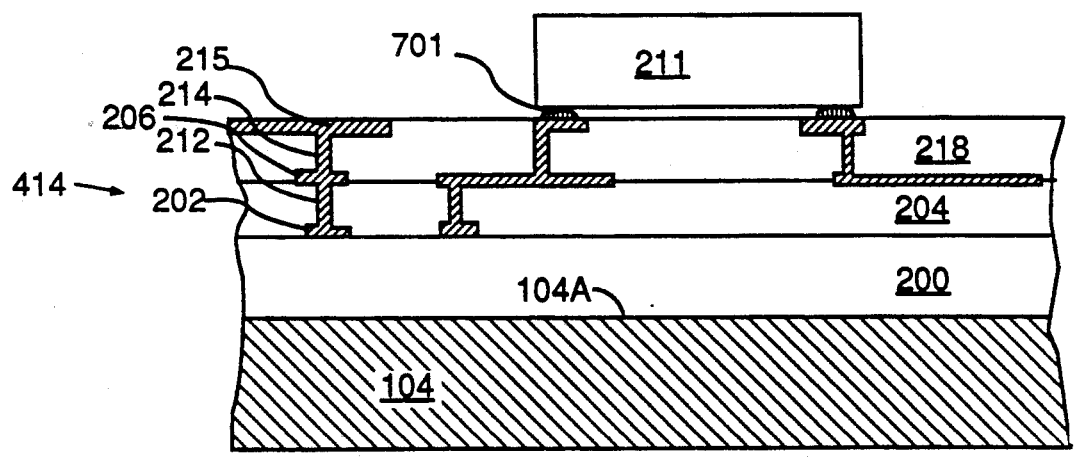
Figure 4D:
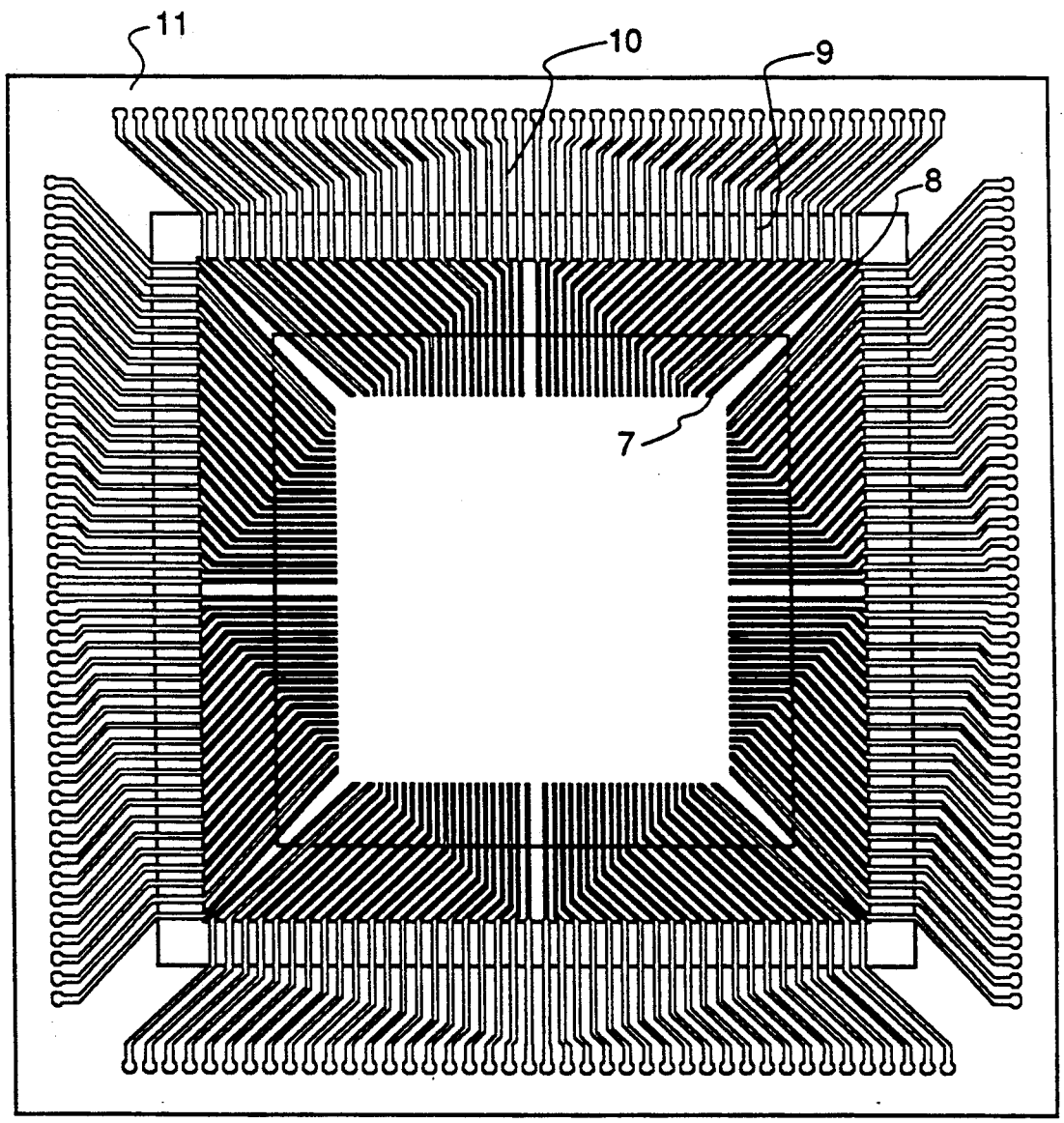
FIGS. 4D and 4E are plan view of typical TAB structures which provide for connection to integrated circuit structures at their centers.
Figure 4E:
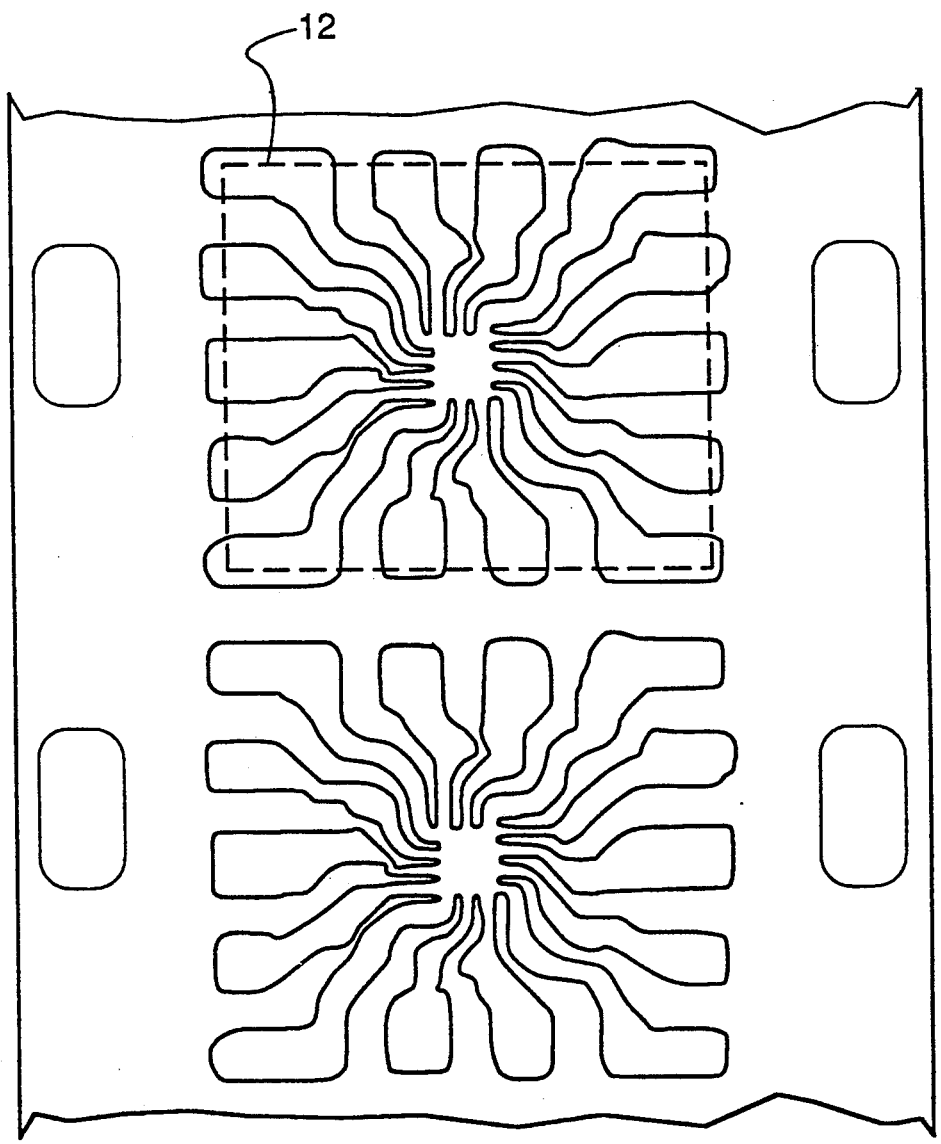

In the embodiment of FIG. 4C the chip is attached directly to the interconnect structure with solder bump bonding. The embodiment of FIG. 4C shows an interconnect structure having three layers of interconnect metallization 202, 206, and 216 separated by insulation 204 and 218 and selectively connected through vias such as 212 and 214 to form the desired interconnect pattern. In the variation shown in FIG. 4C, integrated circuit chip 211 is attached to interconnect structure 114 by means of solder bumps 701 which contact metallization layer 216 in interconnect structure 114. The embodiment of FIG. 4C can be used when the chip 211 is a low power device which generates minimum heat and therefore need not be connected to heatsink 104. When chip 211 will generate high heat the upper surface of chip 211 is thermally connected to a heatsink above chip 211 in a different embodiment. The embodiment of FIG. 4C is not preferred when it is desirable to provide for rework to replace chip 211 if defective.

Figure 5A:
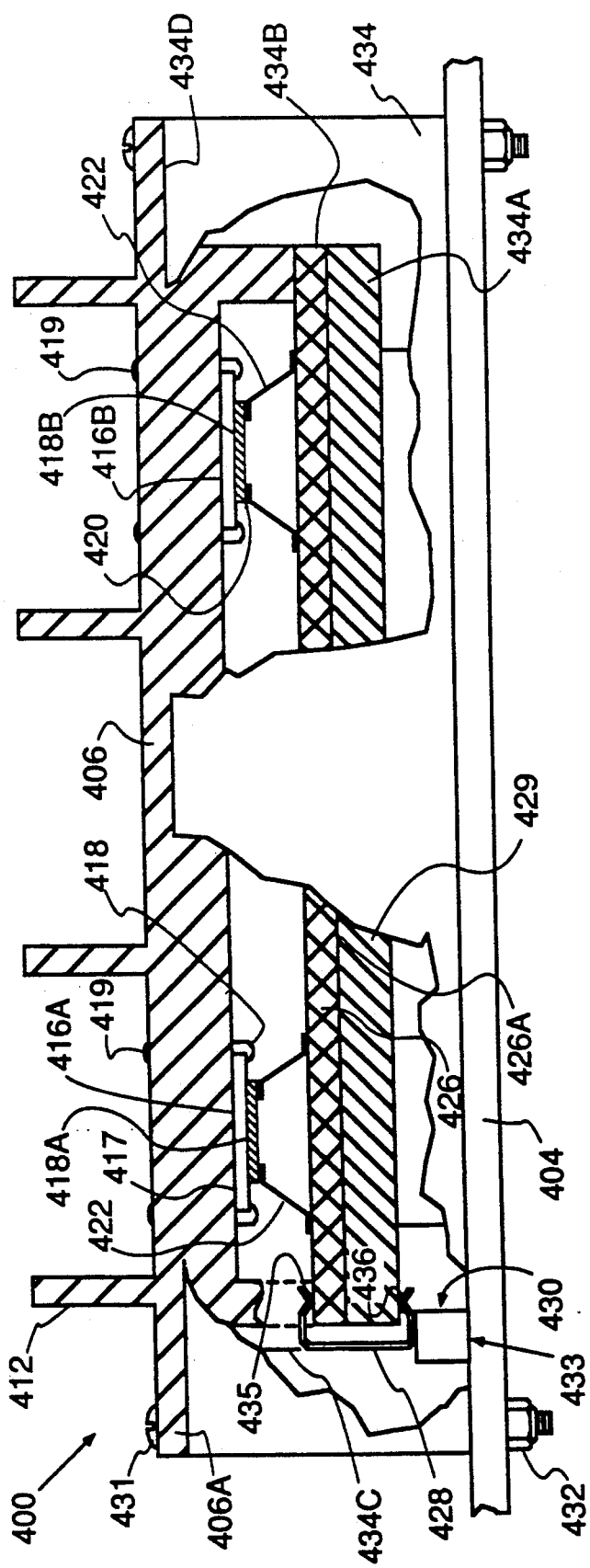
FIG. 5A is a cut-away side cross-sectional view showing an embodiment of the invention in which the interconnect structure is located on the floor of the package and the integrated circuit chips are located on the ceiling of the package.
Figure 5C:
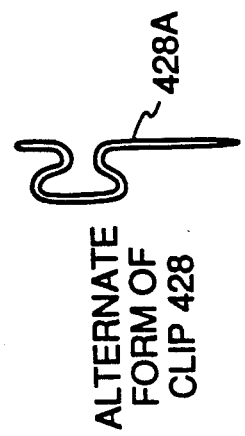
FIG. 5C shows an enlarged view of a clip used in the structure of FIG. 5A.
Figure 5B:
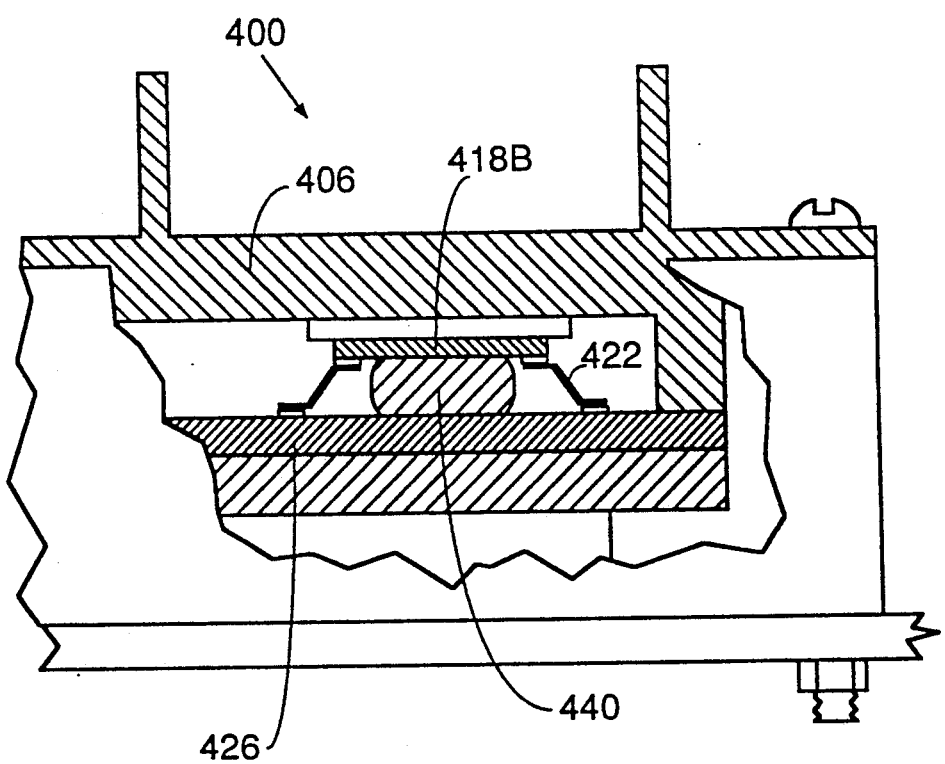
FIG. 5B shows an enlarged view of a structure similar to that of FIG. 5A in which the chip is pressed against the heatsink by an elastomeric disk.

FIG. 5A depicts an embodiment of the invention in which the integrated circuit chips and the interconnect structure are positioned against opposing surfaces of the interior of the package. As shown in FIG. 5A, a multi-chip package 400 is comprised of a backplate 429 on which is mounted an interconnect structure 426. Interconnect structure 426 can be epoxy or solder bond mounted to a backing plate 429 for the purpose of structural strength and protection of the interconnect structure 426. For solder bonding to backing plate 429, the backside 426A of interconnect structure 426 can be coated with a suitable solderable metal such as nickel. Interconnect structure 426 and backplate 429 are aligned and retained within the mating pocket of frame 434. Frame 434 is of such thickness that when the package is mounted on a printed circuit mother board 404 using screws 431 and nuts 432, proper compression of elastomeric connector 430 is achieved between clips (or flex circuit) 428 and contact pads 433 on printed circuit mother board 404. The package also comprises a heatsink 406, typically molybdenum, which may have coolant inlet and outlet flow connections (not shown), or fins 412 for air cooling. Backing plate 429 is made of an insulating material such as ceramic or plastic which is rigid enough to support interconnect structure 426 during manufacturing. Chip electrical contact pads 420 are connected by tape automated bonding (TAB) film 422 to pads 424 on interconnect structure 426. Chips 418A, 418B to which chip bond plates 416A, 416B have been applied are attached to TAB films 422. For thermal dissipation, heatsink 104 is brought into contact with chip bond plates 416A, 416B upon which chips 418A, 418B are bonded. As described earlier, the chip bond plates 416A, 416B are typically made of molybdenum for thermal matching to the silicon chip and are attached to chips 418A, 418B by epoxy or solder. The plates are maintained in intimate thermal contact to heatsink 406 by thermal grease 417 and/or can be clamped to heatsink 408 using miniature clamps 418 which pass through heatsink 406 and are retained by nuts 419. The use of clamps is optional, as thermal grease alone achieves good thermal contact. Alternatively, chip bond plates 416A and 416B may be omitted and the chip attached directly by thermal grease. As a further alternative shown in FIG. 5B, a resilient, electrically non-conducting elastomeric disk 440 of the approximate size of chip 418b, can be placed between chip 418b and interconnect structure 426 such that when heatsink 406 is mounted, elastomeric disk 440 is compressed slightly and thereby transfers pressure to the chip/heatsink interface to achieve good thermal contact. TAB 422 can be readily formed in such a way as to allow such displacement of chip 418B as required during the compression process. In any of the above cases heat generated by the chips 418A, 418B, when operating, is dissipated by heatsink 406 to the coolant or the ambient atmosphere. Electrical connections are made from contact pads 435 on the top periphery of the interconnect structure 426 to pads 436 on the bottom of backing plate 429 by spring clips 428. Alternatively, a wrap-around flexible circuit such as Bradyflex Flexible Circuitry, which comprises parallel copper leads on a Kapton base are bonded between pads 435 and 436. Electrical connection from package 400 to mother board 404 is accomplished through connector 430 (which may be silicon rubber with vertical conductive fibers or a frame including multiple vertically extending pressure contacts) is compressed between clips 428 and mating pads 433 on mother board 404. Compression is provided by corner screws 431 and nuts 432 when the package 400 is mounted. Elastomeric connector 430 is properly positioned and retained by frame 434 which can be molded plastic. In this embodiment, heatsink 406 also serves as a lid for all the chips 418A, 418B etc. in package 400 and frame 434 serves as the containment structure. Frame 434 aligns the contact pads 435 with mating pads 433 by providing surfaces 434A and 434B in its interior corners to provide support and mating containment to the composite of interconnect structure 426 and backing plate 429. Inner wall 434C provides containment for the spring clips or the wrap-around flexible circuit, which are bonded to interconnect structure 426 and backing plate 429 typically on each of four sides. Flange 406A of heatsink 406 rests on surface 434D of frame 434 and is secured to surface 434D when the package 400 is mounted to printed circuit mother board 404. The resultant structure 400 when mounted is rigidly secured and sealed. A variation to this embodiment is achieved when the spring clips 428 shown in FIG. 5A are replaced with another common form of these clips which have a "tail" 428A (see FIG. 5C) for direct insertion into through-holes in a printed circuit board. Such version would eliminate the elastomeric connector 430 used for surface mount applications.

Figure 6:
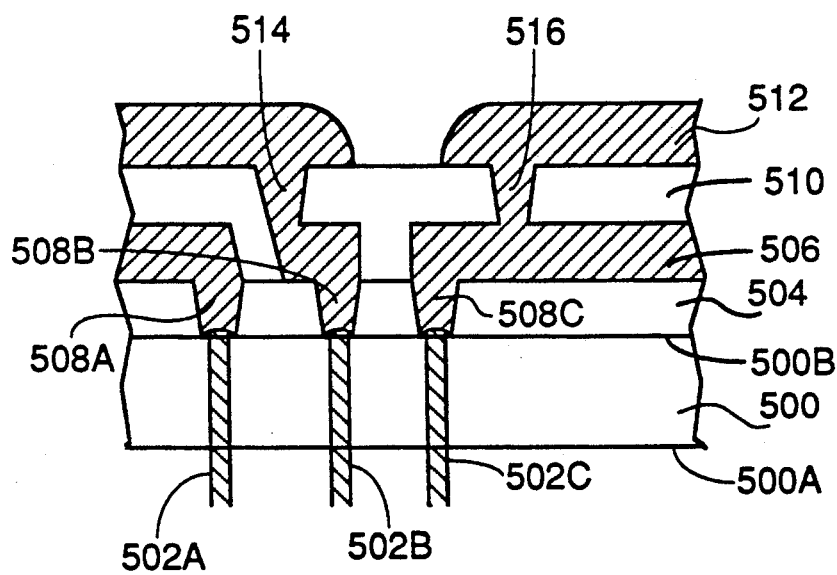
FIG. 6 is a cross-sectional side view of an interconnect structure formed integrally with a plurality of pins extending to the exterior of the package.

A further embodiment of the invention is partially shown in FIG. 6 wherein laser or otherwise drilled holes are provided in insulating plate 500 (preferably glass or ceramic) with terminal pins 502A, 502B, 502C sealed therein. An array of pins represented by pins 502A, 502B, 502C protrude from the lower side 500A of plate 500 for socketing or solder attachment to a printed circuit mother board (not shown) and are flush with the upper side 500B of plate 500. Dielectric 504 and metallization 506 are built up on the front side 500B with appropriately etched and metallized vias 508A, 508B, 508C leading to the terminal pins. Additional dielectric layer 510 is deposited over metallization layer 506 and etched to form vias such as 514, 516. A second metallization layer 512 is then formed over dielectric layer 510.

Front side electrical interconnection layer 512, equivalent to metal layer 122 of FIG. 4A, is provided for connection to contact pads on the chips (not shown in FIG. 6) by wire bonds or TAB bonds.

Figure 7:
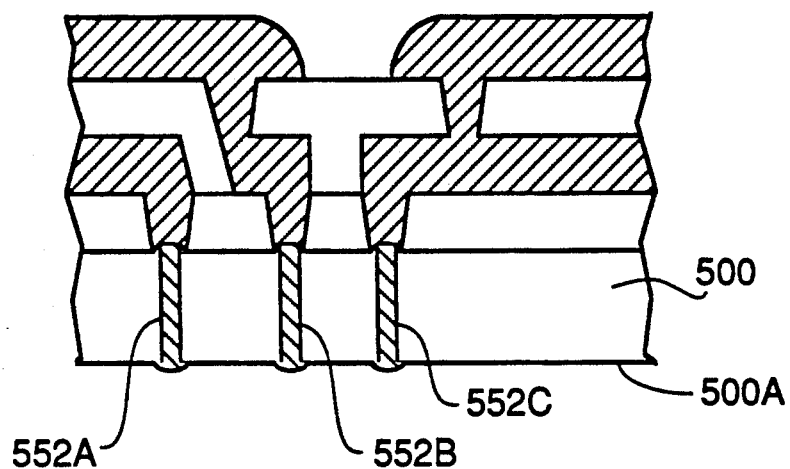
FIG. 7 is a side cross-sectional view of an integrated circuit structure having pins ending flush with the outer surface of the package for solder bump bonding application.

Alternatively, as shown in FIG. 7, the pins 552A, 552B, 552C can be terminated flush with the bottom 500A of plate 500, to provide an array of flat contacts for solder-bump bonding (surface mount) to a printed circuit mother board.

Figure 1:
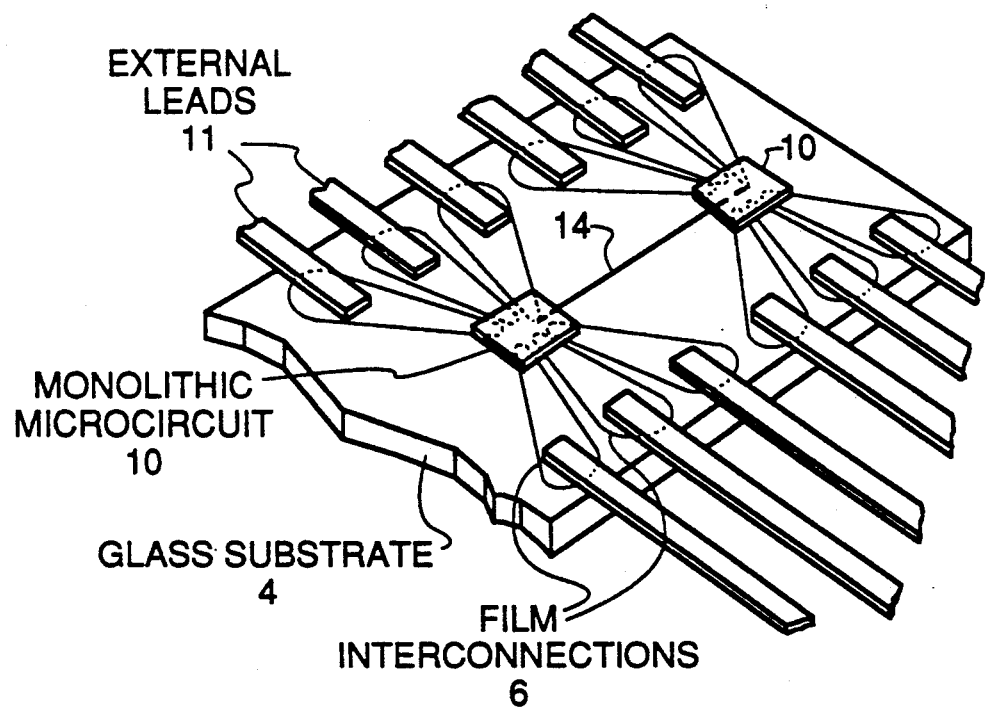
FIG. 1 is a prior art multichip package having connections from chips within the package to external devices and connections between chips within the package.
Figure 2A:
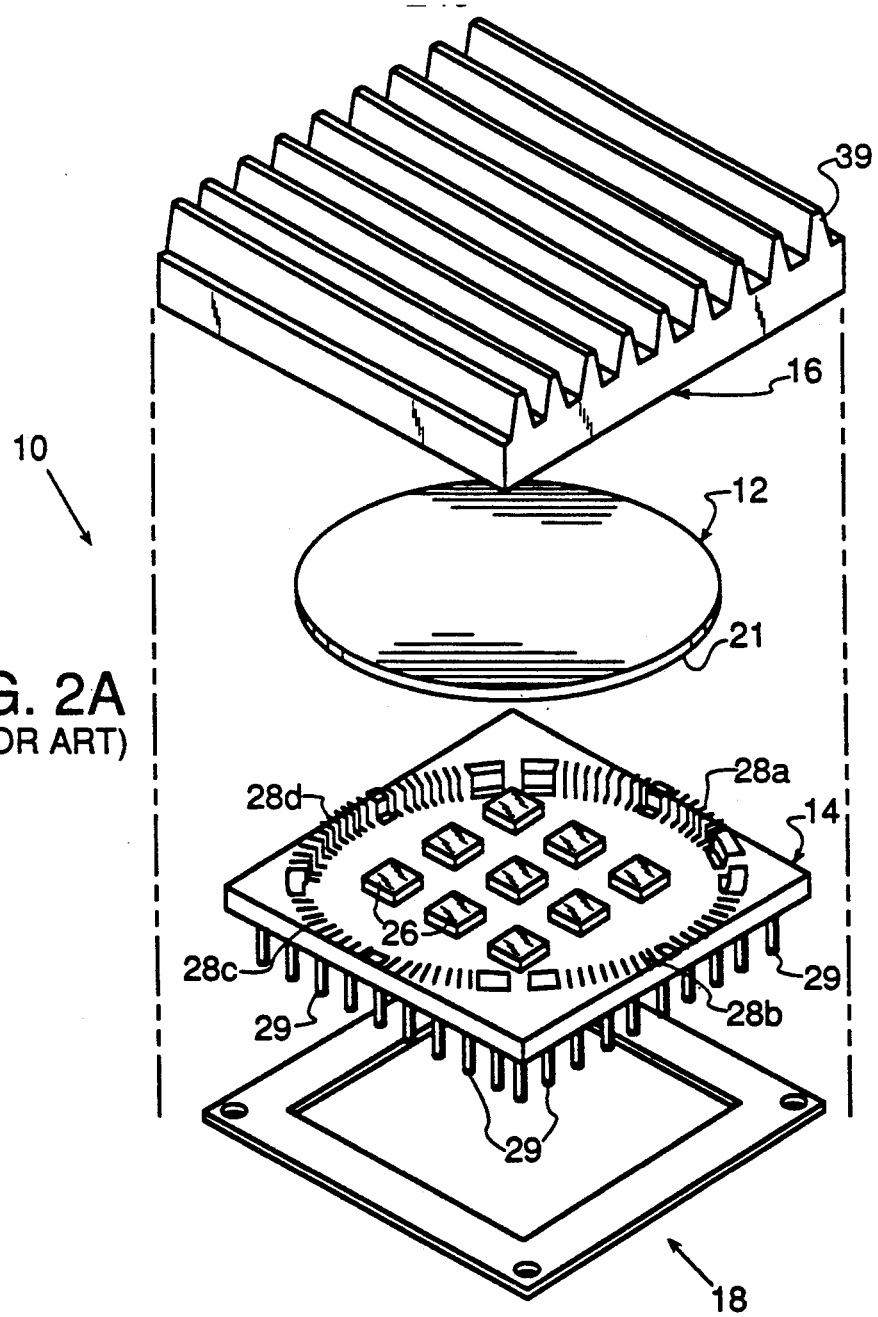
FIGS. 2A and B is a prior art multichip package having a wafer interconnect structure and multiple chips.
Figure 2B:
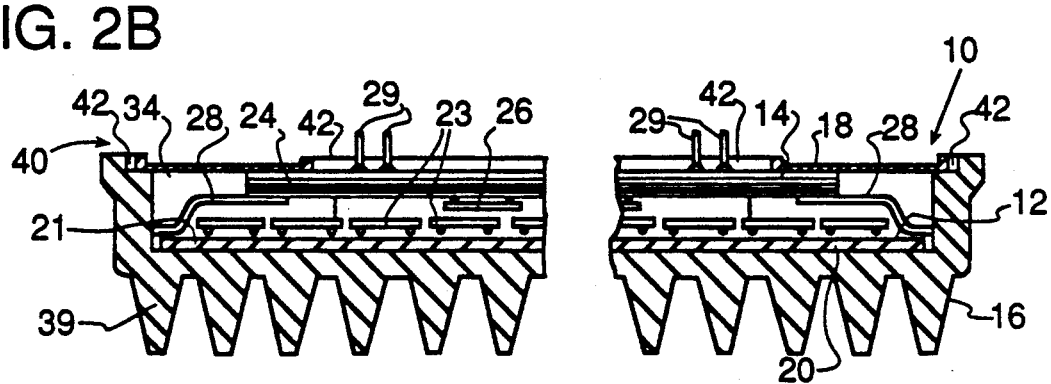
Figure 8:
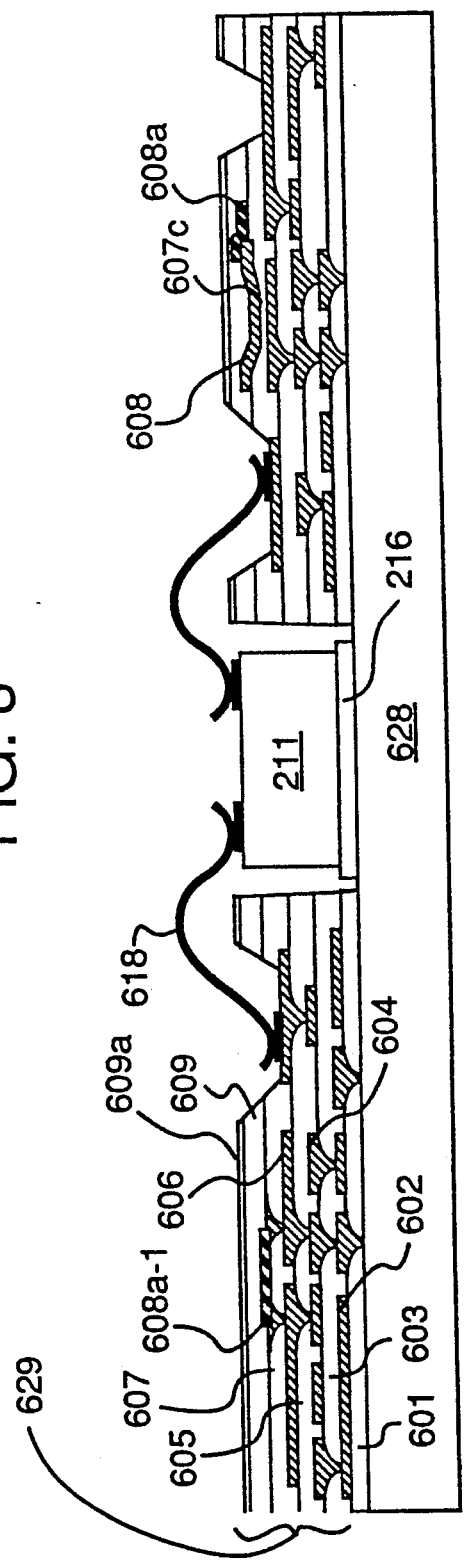
FIG. 8 is a side cross-sectional view of an embodiment using wire bonds as shown in FIG. 4A and including a resistor and capacitor as shown in FIG. 2B.

In a further embodiment shown in FIG. 8, a unitary structure comprising metal plate 628 and interconnect structure 629 constructed thereon, which replaces separately manufactured heatsink 104 and interconnect structure 114 of FIG. 1. Metal plate 628 not only provides highly efficient, direct, opposite-side heat removal for the chips mounted on plate 628, but serves as a base upon which interconnect structure 629 is constructed. Kovar, or other metal such as molybdenum having good thermal conductivity and a good coefficient of thermal expansion match with silicon and silicon dioxide, can be used as the metal of plate 628. Onto a preferably planar metal upper surface of substrate 628 is first deposited a layer 601 of silicon nitride or silicon dioxide, 2 to 20 microns thick. Alternatively, layer 601 can be spin-on-glass. Indeed, the dielectric layers can be any combination of dielectric materials. Layer 601 serves as a base layer for the electrical interconnect just as glass interconnect structure 114 does in the other embodiments. The surface of layer 601 can be polished, if necessary, by chemical or mechanical means. Multilayer interconnect metallization is then built thereon by semiconductor processing techniques as described previously. The embodiment of FIG. 8 shows five insulating layers 601, 603, 605, 607 and 609 separating four conductive metallization layers 602, 604, 606, and 608. Layer 608a adjacent layer 608 comprises nichrome or polycrystalline silicon and is used for resistors such as resistor 608a–l. Insulating layer 607 comprises a composite of silicon oxide and silicon nitride, and is patterned such that only a thin layer of silicon nitride is present between metallization layers 606 and 608 at extensive region 607c, thereby forming a capacitor.

Many structures and combinations of layers such as shown in FIG. 8 are possible and can be manufactured using semiconductor process technology. The interconnect structure of the present invention differs from an integrated circuit chip in that it does not include active devices. As in other embodiments, the interconnect structures can be made in wafer form with several interconnect structures in an array on the same wafer. The wafer can be cut into individual units by laser or saw after processing. Means of interconnect to a printed circuit mother board and containment and sealing are as described for the other embodiments.

Figure 9A:
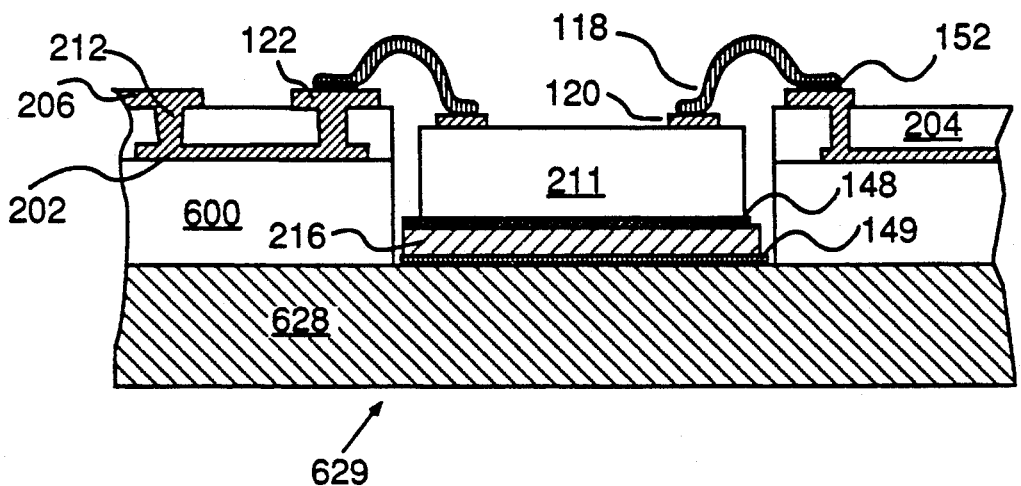
FIGS. 9A through 9C are cross-sectional side views of an interconnect structure and an integrated circuit chip connected by wire bonds, TAB bonds and solder bumps respectively.
Figure 9B:
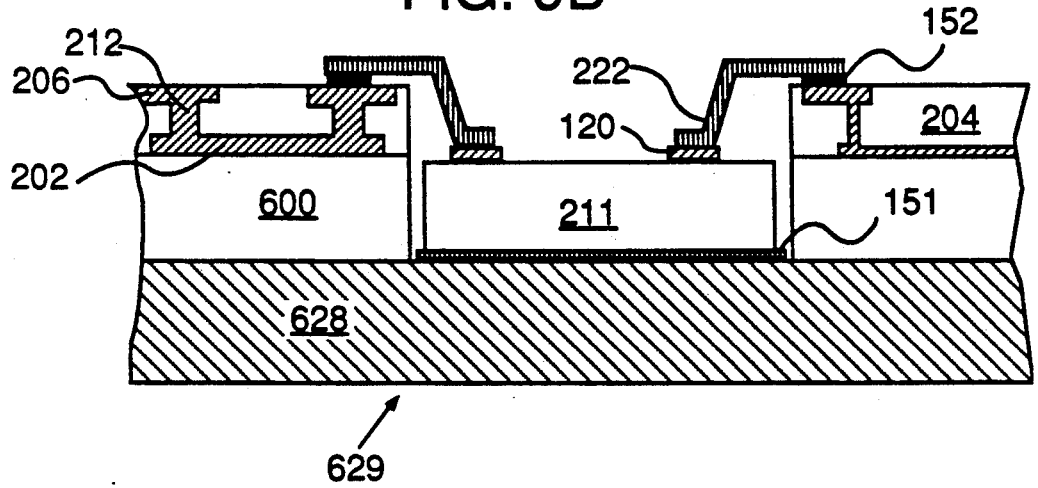
Figure 9C:
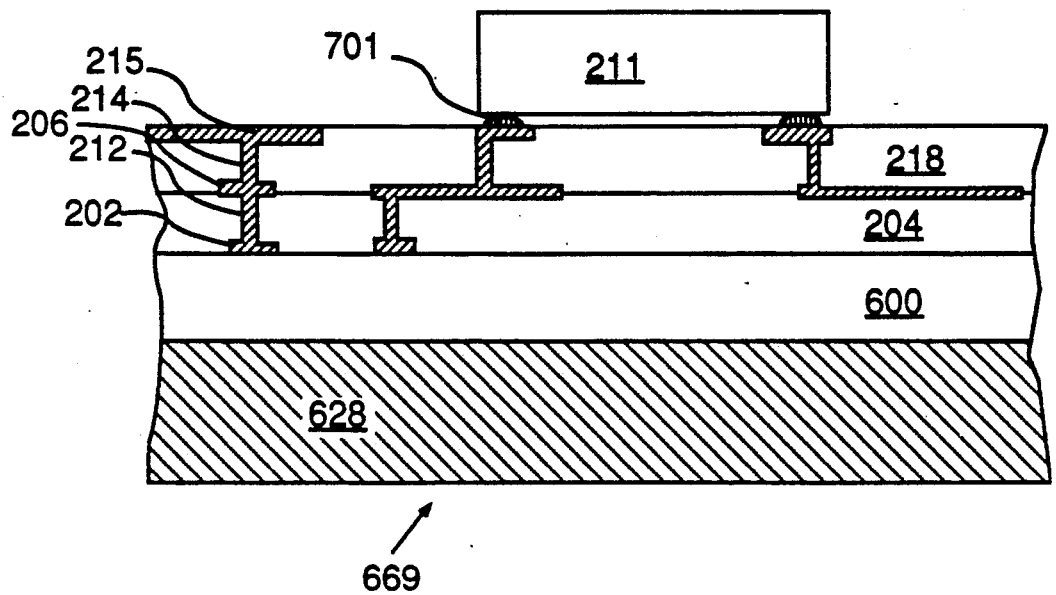

FIGS. 9A–9C illustrate alternative schematic partial cross-sections of FIG. 8. The structures of FIGS. 9A–9C are the same as those of FIGS. 4A–4C except that the interconnect structure 629 is formed on base 628 rather than being attached after manufacture. Therefore, FIGS. 9A–9C are not described in detail.

In all of the above embodiments of the invention, when forming the interconnect structure, in addition to silicon dioxide, silicon nitride, or sputtered quartz, spin-on-glass or polyimide may also be employed as the dielectric, while the metallization may be copper, gold, or aluminum.

The above description of embodiments of this invention is intended to be illustrative and not limiting. Other embodiments of this invention will be obvious to those skilled in the art in view of the above disclosure.

We claim:

1. A multichip package comprising:
   a heatsink;
   a plurality of spaced semiconductor integrated circuit chips thermally connected to said heatsink, said chips each having a plurality of I/O pads;
   a multilayer interconnect structure placed near but spaced from said chips and including:
   a plurality of chip interconnect pads for interconnecting to said chips,
   a plurality of exterior interconnect pads for interconnecting to points exterior to said package; and
   a plurality of interconnect lines, each of said lines interconnecting at least two of said pads;
   means for electrically connecting said chip interconnect pads to selected ones of said I/O pads; and
   means for electrically connecting said exterior interconnect pads to selected ones of said points exterior to said package;
   said interconnect structure including lines having line widths less than 10 microns.

2. A multichip package as in claim 1 in which said heatsink has a planar surface to which said chips are attached.

3. A multichip package as in claim 1 in which said heatsink is of molybdenum.

4. A multichip package as in claim 1 in which said heatsink is of Kovar.

5. A multichip package as in claim 1 in which said heatsink forms an exterior wall of said multichip package.

6. A multichip package as in claim 1 in which each of said integrated circuit chips is bonded to a thermally conductive chip bond plate using a thermally conductive means for bonding, and said chip bond plate is in turn soldered to said heatsink using thermally conductive solder having a melting point sufficiently low that each of said integrated circuit chips can be removed from said package by melting said solder and removing said chip bond plate.

7. A multichip package as in claim 6 in which said means for bonding said chips to said chip bond plate is a material taken from the group comprising epoxy, silicon gold eutectic, silicon-tin-gold eutectic, and high temperature solder.

8. A multichip package as in claim 1 in which each of said integrated circuit chips is bonded to a thermally conductive chip bond plate using a thermally conductive means for bonding, and said chip bond plate is in turn soldered to said heatsink using thermally conductive solder having a melting point sufficiently low that each of said integrated circuit chips can be thermally connected to said heat sink without disturbing said thermally conductive means for bonding said chip to said plate and without heating said chip to a temperature higher than that at which said chips have been tested.

9. A multichip package as in claim 1 in which said interconnect structure includes a plurality of apertures and each of said integrated circuit chips is located within one of said apertures.

10. A multichip package as in claim 1 in which said interconnect structure comprises:
    an electrically insulating base plate;
    a first metallization layer on said base plate having patterned metal lines;
    at least a first dielectric layer extending over said first metallization and patterned with vias; and
    at least a top metallization layer on a surface of said interconnect structure including extensions through vias in at least one of said at least a first dielectric layer and including pads for interconnecting said chips.

11. A multichip package as in claim 1 wherein said means for electrically connecting said chip interconnect pads to selected ones of said I/O pads comprises wiring means.

12. A multichip package as in claim 1 in which said wiring means comprises a TAB bonding tape having lines connected at one end to said pads of said integrated circuit chips and at the other end to corresponding ones of said pads of said interconnect structure.

13. A multichip package as in claim 1 further comprising a printed circuit mother board extending parallel to said heatsink with said chips and said interconnect structure located between said mother board and said heatsink.

14. A multichip package as in claim 13 in which said points exterior to said package are points on said mother board.

15. The multichip package of claim 1 in which said interconnect structure is spaced from and extends parallel to said heatsink.

16. The multichip package of claim 1 in which said interconnect structure includes a backing plate facing a mother board and wherein said means for electrically connecting said exterior interconnect pads to selected ones of said points exterior to said package comprises at least one elastomeric interconnect strip extending from a peripheral edge of said interconnect structure.

17. The multichip package of claim 1, in which said interconnect structure is apertured to form multiple chip wells and wherein peripheral side edges of said wells spacedly surround peripheral side edges of said chips and said means for electrically connecting said chip interconnect pads to selected ones of said I/O pads bridges across a gap between said respective side edges.

18. The multichip package of claim 17, in which said interconnect structure is mounted to said heatsink.

19. The multichip package of claim 17, further including an electrically insulating frame mounted on said heatsink cooperating with said heatsink to enclose said chips and said interconnect structure, and wherein said means for connecting said exterior interconnect pads to selected ones of said points exterior extends through said frame from said interconnect structure to a mother board.

20. The multichip package of claim 19, in which said frame includes apertures above each of said wells to permit application of said means for electrically connecting said chip interconnect pads to said selected ones of said I/O pads; and includes chip lids covering said frame apertures.

21. The multichip package of claim 19, in which said means for electrically connecting are wire bonds.

22. The multichip package of claim 15, in which said means for electrically connecting comprises TAB bonding tape.

23. The multichip package of claim 19, wherein said frame is rectangular and includes a series of peripheral rectangular through-slots for passage of said means for connecting said exterior interconnect pads to select ones of said points exterior to said mother board.

24. The multichip package of claim 1, in which said means for electrically connecting are wire bonds.

25. The multichip package of claim 1 in which said means for electrically connecting comprise TAB bonding tape.

26. The multichip package of claim 1 in which said plurality of spaced semiconductor integrated circuit chips comprise at least four spaced chips, and said interconnect structure has mitered corners allowing attachment means to be attached to said backing plate.

27. The multichip package of claim 1 in which said interconnect lines are formed less than 10 microns in width.

28. The multichip package of claim 1 wherein said means for connecting said exterior interconnect pads to selected ones of said points exterior includes spring clips mountable over peripheral edges of said interconnect structures and an elastomeric conductor providing electrical connection between each of said clips and corresponding points on a mother board.

29. The multichip package of claim 1 wherein said interconnect structure is formed on an electrically insulating base plate including a series of apertures, an array of contact pins passes through said base plate to a mother board, and a series of metallized vias extends between selected lines in a first interconnect metallization layer in said interconnect structure and said array of pins.

30. The multichip package of claim 1 wherein said interconnect structure is built up on, and becomes an integral part of, said heatsink.

31. The multichip package of claim 1 wherein said means for connecting said exterior interconnect pads to selected ones of said points exterior includes flexible conductors on an insulative base that extend around at least one peripheral edge of said interconnect structure, and an elastomeric conductor providing electrical connection between said flexible conductors and corresponding points on a mother board.

32. The multichip package of claim 1 wherein said interconnect structure includes thin film resistors and capacitors.

33. The multichip package of claim 17 wherein said interconnect structure includes thin film resistors and capacitors.

34. The multichip package of claim 30 wherein said frame holds said interconnect structure in alignment with said heatsink.

35. The multichip package of claim 20 wherein said frame forms a spacer structure for limiting compression of elastomeric connectors between said interconnect structure of said package and a mother board.

36. The multichip package of claim 20 wherein said frame cooperates with said heatsink to seal said chips and said interconnect structure within said package.

37. A multichip package as in claim 1 in which said chip interconnect pads each include multiple bonding sites.

38. A multichip package as in claim 19 in which said chip interconnect pads each include multiple bonding sites.

39. A multichip package as in claim 29 in which said chip interconnect pads each include multiple bonding sites.

40. A multichip package as in claim 1 in which said heatsink forms a ceiling of said package.

41. A multichip package as in claim 40 in which said chips are each attached to a plate which is held in thermal contact with said heatsink by means of at least one clip or bolt.

42. A multichip package as in claim 40 in which said chips are each attached to a plate which is held in thermal contact with said heatsink by means of thermal grease.

43. A multichip package as in claim 40 in which each chip of said chips is attached to a plate which is held in thermal contact with said heatsink by means of an elastomeric member located between a floor of said package and said chip.

44. A multichip package as in claim 40 in which said chips are held in thermal contact with said heatsink by thermal grease.

45. A multichip package as in claim 40 in which each chip of said chips is held in thermal contact with said heatsink by an elastomeric member located between a floor of said package and said chip.

46. A multichip package comprising:
a heatsink;
a plurality of spaced semiconductor integrated circuit chips thermally connected to said heatsink through a thermally conductive chip bond plate using thermally conductive means for bonding, said chips each having a plurality of I/O pads;
a multilayer interconnect structure placed near but spaced from said chips and including:
a plurality of chip interconnect pads for interconnecting to said chips,
a plurality of exterior interconnect pads for interconnecting to points exterior to said package; and
a plurality of interconnect lines, each of said lines interconnecting at least two of said pads;
means for electrically connecting said chip interconnect pads to selected ones of said I/O pads; and
means for electrically connecting said exterior interconnect pads to selected ones of said points exterior to said package;
said thermally conductive means for bonding comprising a first bonding means between said chip bond plate and said heatsink, and a second bonding means between said bonding plate and said chip which retains its bonding ability at a temperature which melts said first bonding means.

47. A multichip package as in claim 46 in which said first bonding means comprises a layer of solder.

48. A multichip package as in claim 47 in which said second bonding means comprises a material taken from the group comprising epoxy, silicon-gold eutectic, silicon-tin-gold eutectic, and high temperature solder.

49. A multichip package as in claim 46 in which some of said interconnect lines are electrically insulated from each other and separated by less than 125 microns.

50. A multichip package having an interior and an exterior and comprising:
a heatsink;
a plurality of semiconductor integrated circuit chips thermally connected to said heatsink, including at least a first chip and a second chip, said chips each having a plurality of I/O pads;
a plurality of conductors accessible at said exterior of said package;
an interconnect structure including:
means for connecting selected ones of said I/O pads of said first chip to selected ones of said I/O pads of said second chip, and means for connecting selected ones of said I/O pads of at least some of said chips to selected ones of said plurality of conductors extending exterior to said package;

wherein each of said chips is held in thermal contact with said heatsink by an elastomeric member located between said chip and a surface of said package opposite said heatsink.

51. A multichip package comprising:

a heatsink;

a plurality of spaced semiconductor integrated circuit chips thermally connected to said heatsink, said chips each having a plurality of I/O pads;

a multilayer interconnect structure placed near but spaced from said chips and including:

a plurality of chip interconnect pads for interconnecting to said chips, a plurality of exterior interconnect pads for interconnecting to points exterior to said package; and a plurality of interconnect lines, each of said lines interconnecting at least two of said pads;

means for electrically connecting said chip interconnect pads to selected ones of said I/O pads; and means for electrically connecting said exterior interconnect pads to selected ones of said points exterior to said package including flexible conductors alternating with flexible insulators, said flexible conductors providing electrical connection between said exterior interconnect pads and points on a mother board.

* * * * *

UNITED STATES PATENT AND TRADEMARK OFFICE
CERTIFICATE OF CORRECTION

PATENT NO.    :   5,182,632
DATED         :   January 26, 1993
INVENTOR(S)   :   Richard L. Bechtel et al.

It is certified that error appears in the above-identified patent and that said Letters Patent is hereby corrected as shown below:

At column 13, line 24, Claim 2, delete "muItichip" and substitute --multichip--.

At column 14, line 12, Claim 12, delete "claim 1" and substitute --claim 11--.

Signed and Sealed this

Twenty-sixth Day of April, 1994

Attest:

BRUCE LEHMAN

*Attesting Officer*       *Commissioner of Patents and Trademarks*